US007023785B2

(12) United States Patent
Van Der Stappen

(10) Patent No.: US 7,023,785 B2
(45) Date of Patent: Apr. 4, 2006

(54) METHOD FOR MANUFACTURING A RECORD CARRIER AS WELL AS SUCH A RECORD CARRIER

(75) Inventor: Arnoldus J M Van Der Stappen, Best (NL)

(73) Assignee: Singulus Mastering B.V., Eindhoven (NL)

( * ) Notice: Subject to any disclaimer, the term of this patent is extended or adjusted under 35 U.S.C. 154(b) by 81 days.

(21) Appl. No.: 10/416,270

(22) PCT Filed: Nov. 9, 2001

(86) PCT No.: PCT/NL01/00816

§ 371 (c)(1),
(2), (4) Date: Oct. 14, 2003

(87) PCT Pub. No.: WO02/39447

PCT Pub. Date: May 16, 2002

(65) Prior Publication Data

US 2004/0057367 A1 Mar. 25, 2004

(30) Foreign Application Priority Data

Nov. 9, 2000 (NL) .................................... 1016579

(51) Int. Cl.
*G11B 7/00* (2006.01)

(52) U.S. Cl. ................................ 369/59.25; 369/53.21

(58) Field of Classification Search ............ 369/53.21, 369/59.25
See application file for complete search history.

(56) References Cited

U.S. PATENT DOCUMENTS 6,005,839 A 12/1999 Sako et al. .............. 369/275.3
6,278,386 B1 * 8/2001 Hogan ......................... 341/58
6,452,885 B1 * 9/2002 Yeo ......................... 369/53.21
6,542,452 B1 * 4/2003 Wu et al. ................ 369/59.24

FOREIGN PATENT DOCUMENTS

EP 0 918 326 A1 5/1999

* cited by examiner

*Primary Examiner*—A. L. Wellington
*Assistant Examiner*—Lixi Chow
(74) *Attorney, Agent, or Firm*—Pillsbury Winthrop Shaw Pittman LLP

(57) ABSTRACT

A record carrier, and method for manufacturing such record carrier, which can be copies with the aid of a copying apparatus, while the copied record carrier is unreadable. During copying with the aid of the copying apparatus, merge bits are selected such that consecutive channel bits or a first type, the type "1", are separated by at least Ia and at most Ib consecutive and continuous bits of the second type, the type "0", and vice versa. The original record carrier, at least over a number of neighboring blocks of channel bits, is provided with specific blocks of merge bits, while consecutive channel bits of one type are separated by Ic or Id consecutive bits of the other type, with Ic<Ia and Id>Ib.

5 Claims, 6 Drawing Sheets

METHOD FOR MANUFACTURING A RECORD CARRIER AS WELL AS SUCH A RECORD CARRIER

Figure 1:
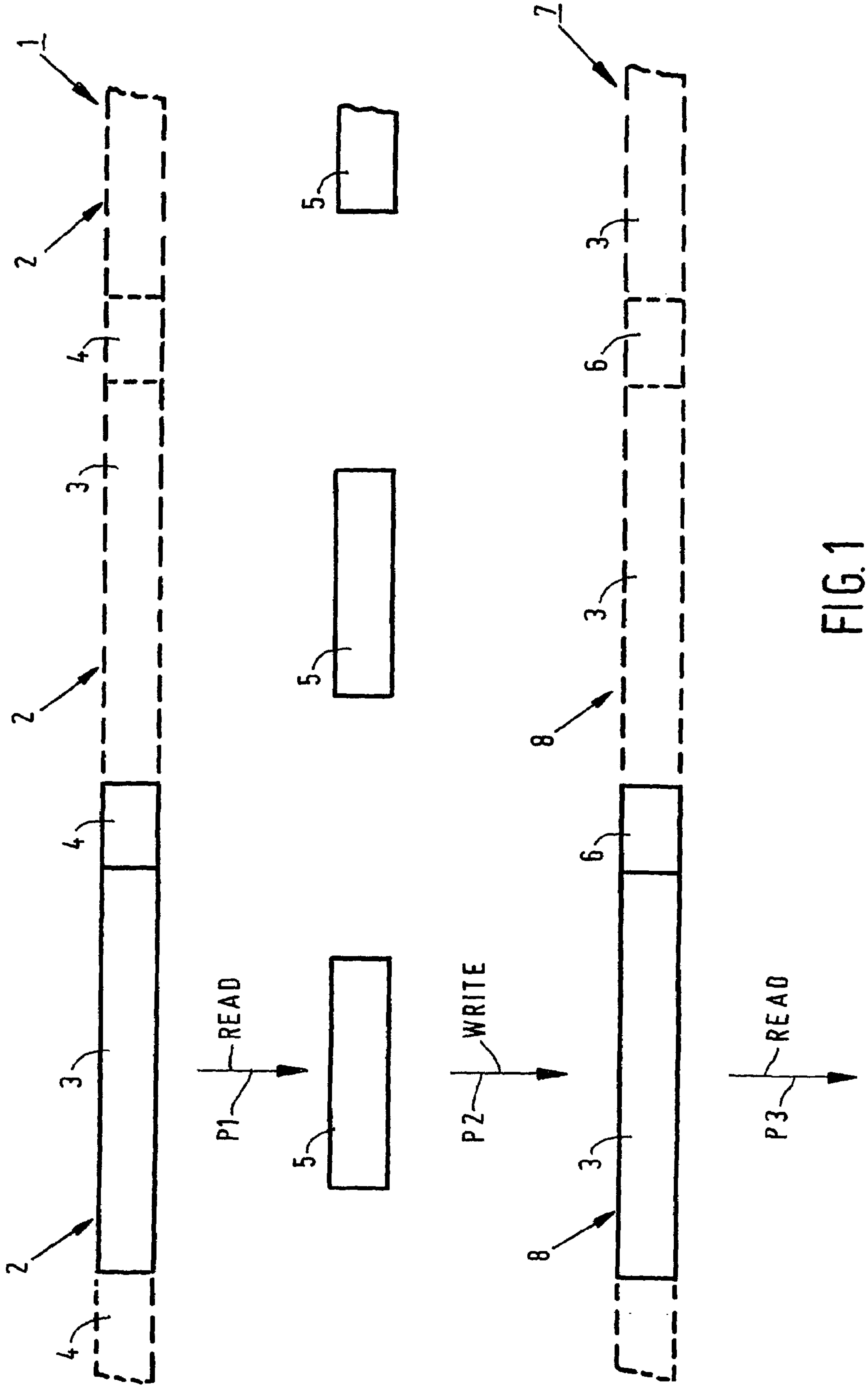

This is the U.S. National Stage of International Application No. PCT/NL01/00816, filed on Nov. 9, 2001, which designated the U.S. and that International Application was published under PCT Article 21(2) in English.

This invention relates to a method for manufacturing a record carrier which can be copied with the aid of a copying apparatus, whilst the copied record carrier is unreadable, which original record carrier is provided with a series of binary data bits which has been encoded into a series of binary channel bits, which series of data bits has been divided into consecutive blocks of m data bits each, which blocks have been encoded into consecutive blocks of (n1+n2) channel bits ((n1+n2)>m), which blocks of channel bits each comprise a block of n1 information bits and a block of n2 merge bits, with consecutive blocks of information bits separated in each case by a block of merge bits, while during copying with the aid of the copying apparatus, the merge bits are selected such that consecutive channel bits of a first type, the type "1", are separated by at least Ia and at most Ib consecutive and continuous bits of the second type, the type "0", and vice versa.

The invention further relates to a record carrier manufactured with the aid of such method.

Record carriers in this patent application are understood to include inter alia optical record carriers such as, for instance, CD.

There are various methods known for manufacturing record carriers which, with the aid of copying equipment available to the consumer, can be copied completely, can be copied only a single time, or cannot be copied at all. In the original record carriers, codes may be stored which are not copied during copying with the copying equipment available to the consumer, as a result of which a copied record carrier manufactured with the aid of the copying apparatus cannot function. This means that such a copied record carrier cannot be listened to and/or that the software stored thereon cannot be started up or does not function as desired.

In a method known per se, on the original record carrier, at particular control positions, control effects, also referred to as watermarks or keys, are provided. In the use of the record carrier, there is first a check for the presence of such watermarks before the software stored thereon is started up. This means, however, that the lawful owner of an original record carrier must wait relatively long before the software is started up.

The watermarks are not copied during copying with the copying equipment available to the consumer. In an attempt to read out the copied record carrier, it is established relatively fast that it does not contain the watermarks, so that the copied record carrier will not be started up.

The object of the invention is to provide a method for manufacturing a record carrier which is simply readable, whilst a copy manufactured therefrom is not readable.

This object is achieved in the method according to the invention in that the original record carrier, at least over a number of neighboring blocks of channel bits, is provided with specific blocks of merge bits, while consecutive channel bits of one type are separated by at most Ic or at least Id consecutive bits of the other type, with Ic<Ia and Id>Ib, as a result of which, in a record carrier copied with the aid of the copying apparatus, a digital sum variance, which is proportional to a difference, present over a number of blocks of channel bits, between the number of channel bits of one type and the number of channel bits of the other type, becomes impermissibly large.

The original record carrier will enable relatively fast readout without any problems, while in attempting to start up the copied record carrier, relatively much time will lapse before it is established that it is not readable.

In the manufacture of CDs, it has been agreed internationally that the minimum consecutive number of channel bits of a kind is three (Ia=3), while the maximum number of consecutive channel bits of a kind is eleven (Ib=11). During copying with the aid of a copying apparatus, the blocks of information bits of the original record carrier are read out and in the copying apparatus, blocks of merge bits are generated which must principally ensure that the consecutive blocks of channel bits meet two requirements. The first requirement is that the number of consecutive channel bits of a particular type is 3 at a minimum and 11 at a maximum. A second requirement is that, over a number of blocks of channel bits, the difference between the number of channel bits of one type and the number of channel bits of the other type remains relatively limited. This last is also referred to as digital sum variance. This is of importance to enable (continued) proper discrimination between a bit of one type and a bit of the other type.

The method according to the invention, in manufacturing the record carrier, involves a deliberate deviation from the internationally fixed rules with regard to the minimum and maximum number of consecutive channel bits over at least a part of the record carrier. Through a suitable choice of the merge bits, it is possible to ensure here that despite the presence of deviant numbers of consecutive channel bits, still a relatively limited disturbance of the digital sum variance is obtained.

If such a record carrier is copied with a current copying apparatus, it is not possible to generate such series of merge bits that deviant numbers of consecutive channel bits are obtained. As the merge bits in the copying apparatus are selected such that the number of consecutive channel bits i meets the relation Ia≦i≦Ib, it will be substantially impossible to ensure at the same time that the digital sum variance remains relatively limited. During copying of the original record carrier, however, no hindrance is sustained from the digital sum variance. However, in playing the copied record carrier, the digital sum variance does become noticeable and will lead to the copied record carrier becoming unreadable.

An embodiment of the method according to the invention is characterized in that the original record carrier, at least adjacent the specific blocks of merge bits, is provided with specific blocks of information bits as a result of which, in a record carrier copied with the copying apparatus, the digital sum variance becomes impermissibly large relatively fast.

With the aid of the blocks of information bits, which as such meet the internationally agreed standards, series of consecutive blocks of information bits can be realized which can cause a relatively large digital sum variance relatively fast. In the original record carrier manufactured with the aid of the method, it is possible, through the use of the above-indicated specific blocks of merge bits, not to permit this digital sum variance to become impermissibly large. However, if such blocks of information bits are copied with the aid of a conventional copying apparatus, there will be added to them blocks of merge bits that do meet the requirement that the number of consecutive channel bits i satisfy Ia≦i≦Ib. If this requirement is met, it is found that the digital sum variance becomes impermissibly large relatively fast.

In this way, it is possible, over a relatively short portion on the original record carrier, to use specific blocks of merge bits as a result of which, in a copied record carrier, disturbances will arise on the basis of which it is established that a copy is involved.

The only manner in which the record carrier manufactured with the aid of the method can be copied and the digital sum variance is prevented from becoming impermissibly large is to copy the record carrier bit by bit. Such equipment, however, is considerably more expensive than copying equipment currently available to the consumer. Moreover, bit-by-bit copying has the drawback of giving rise to errors relatively easily, both in reading and in writing, because in that procedure all kinds of control mechanisms that are present in a conventional copying apparatus are no longer applied.

Figure 2:
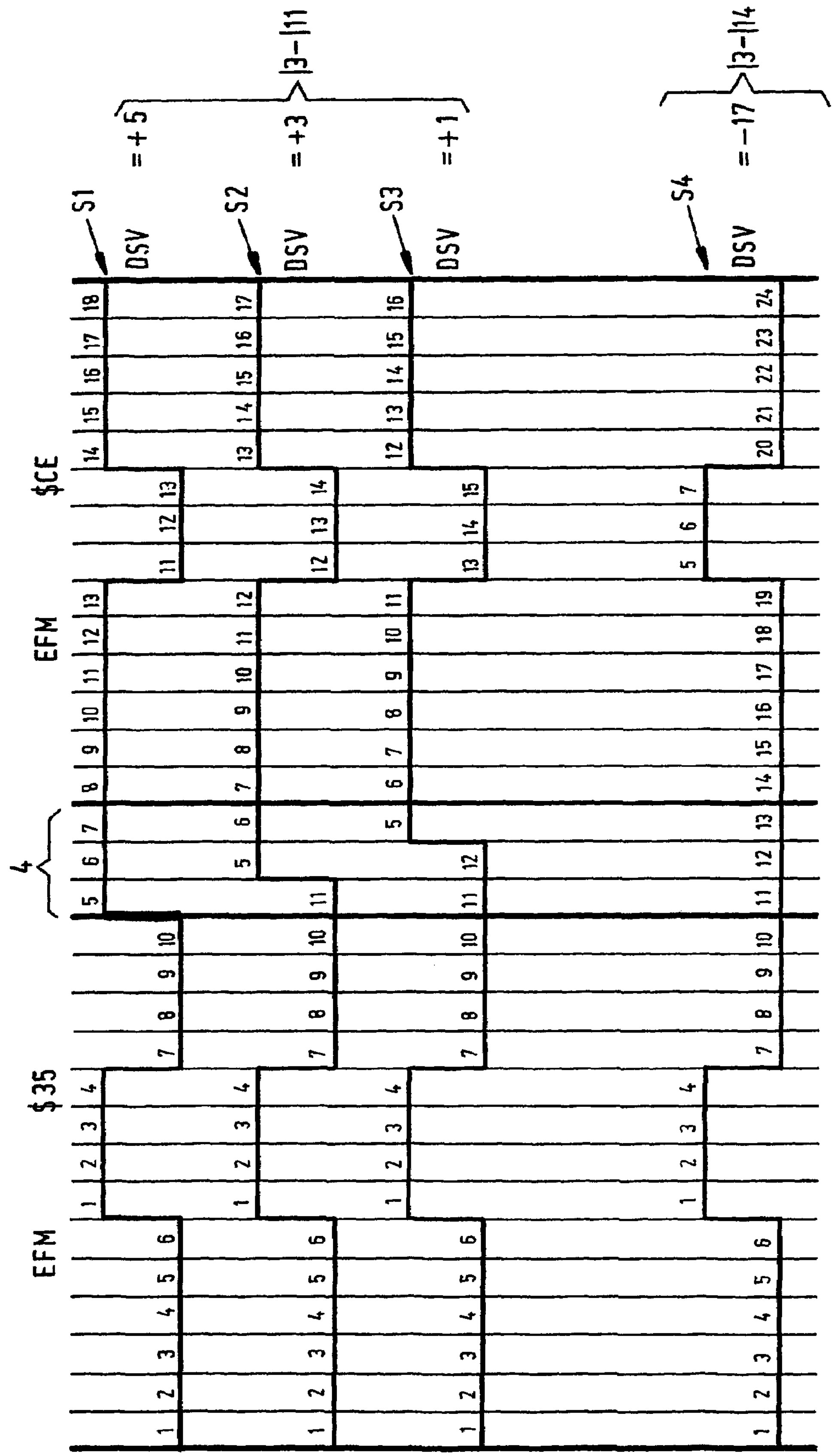
Figure 3:
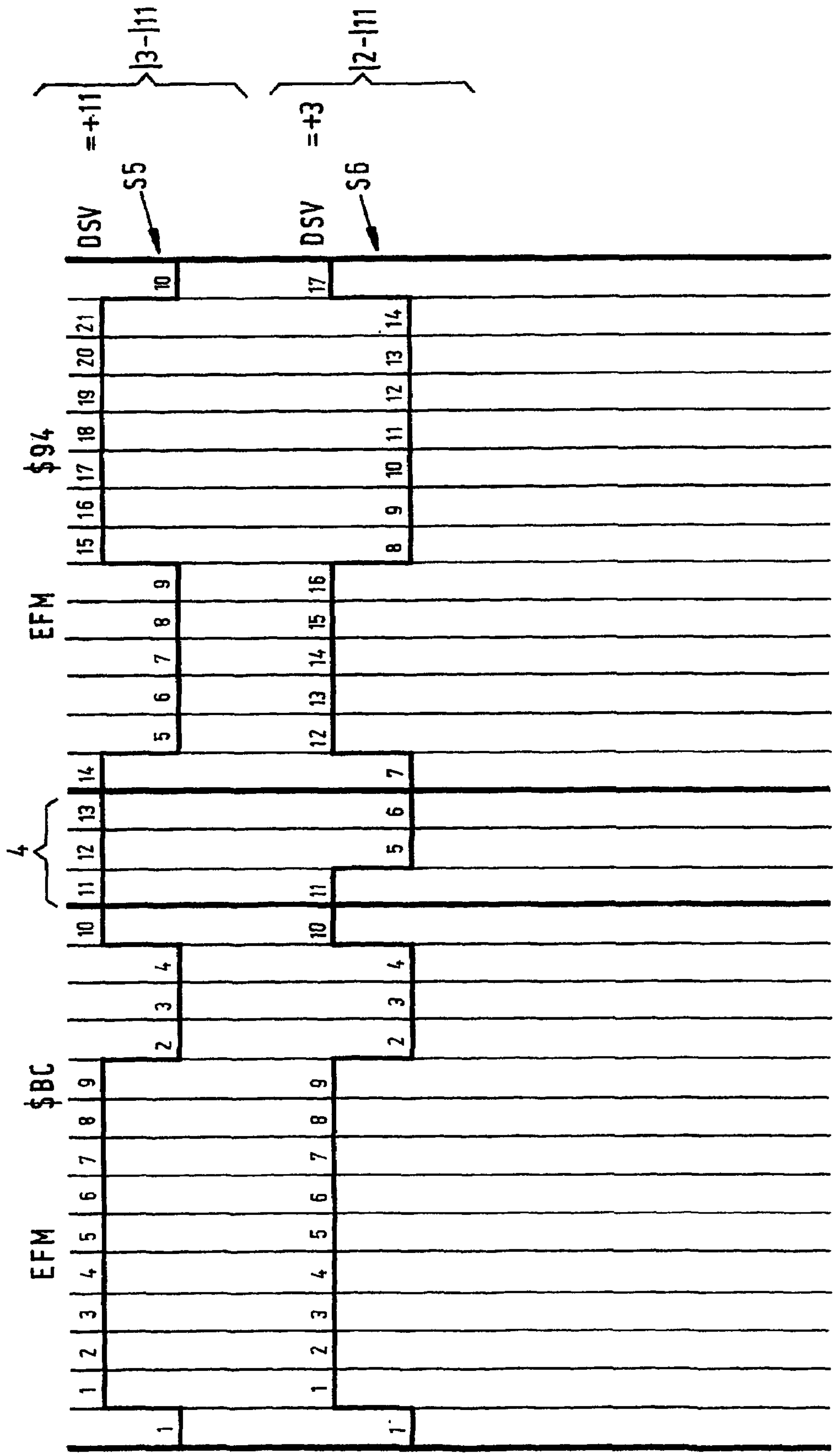
Figure 4:
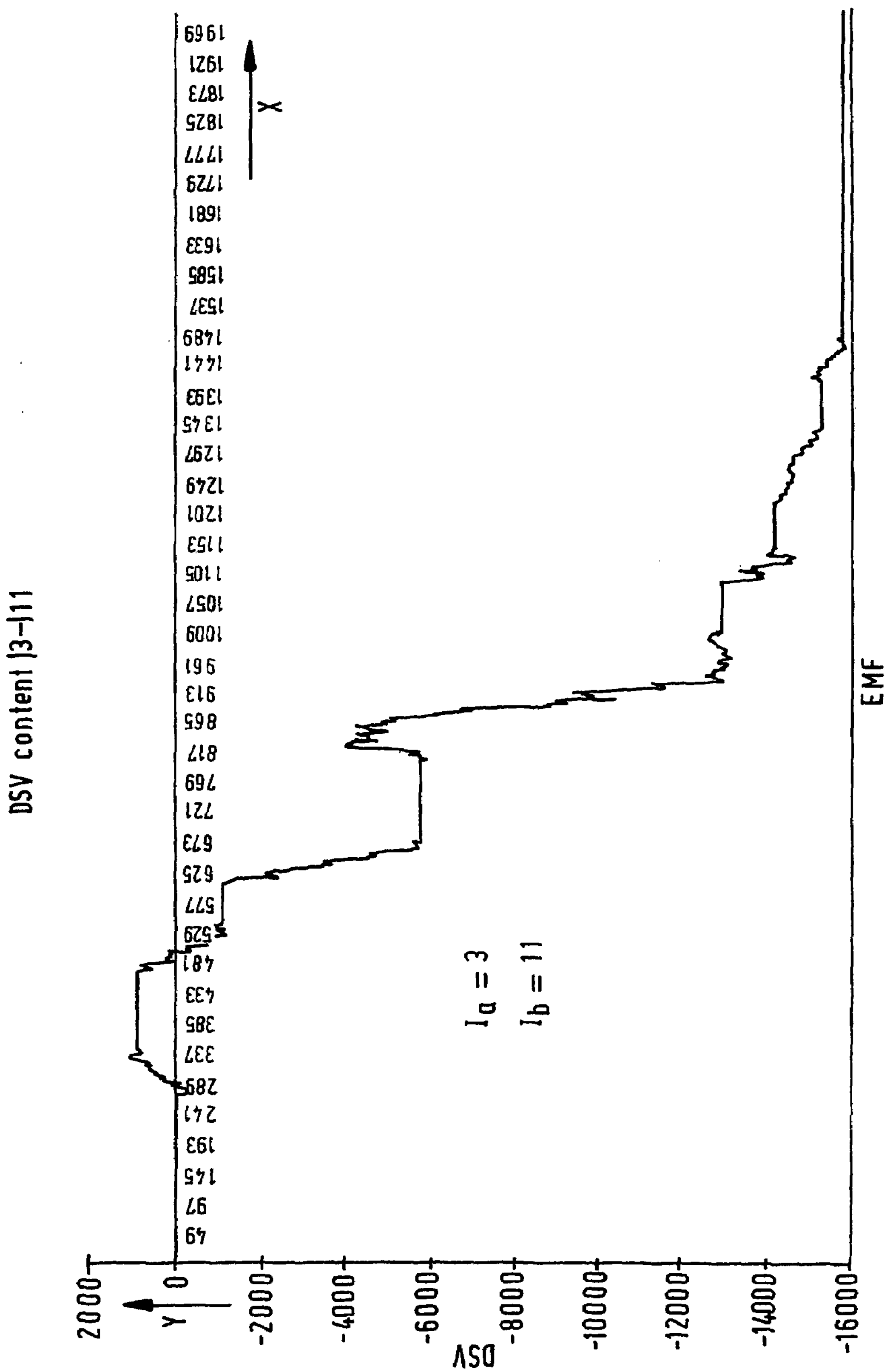
Figure 5:
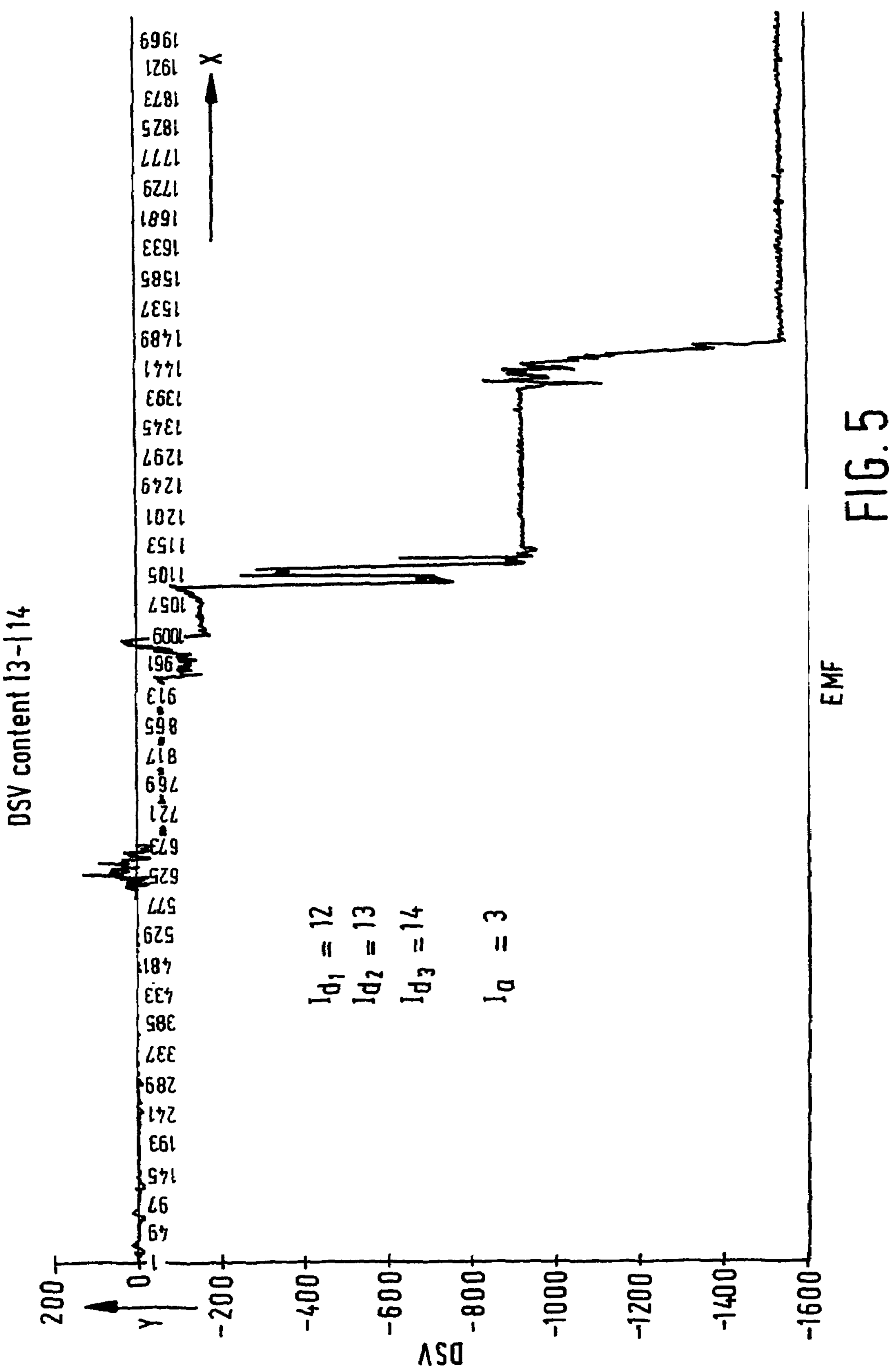
Figure 6:
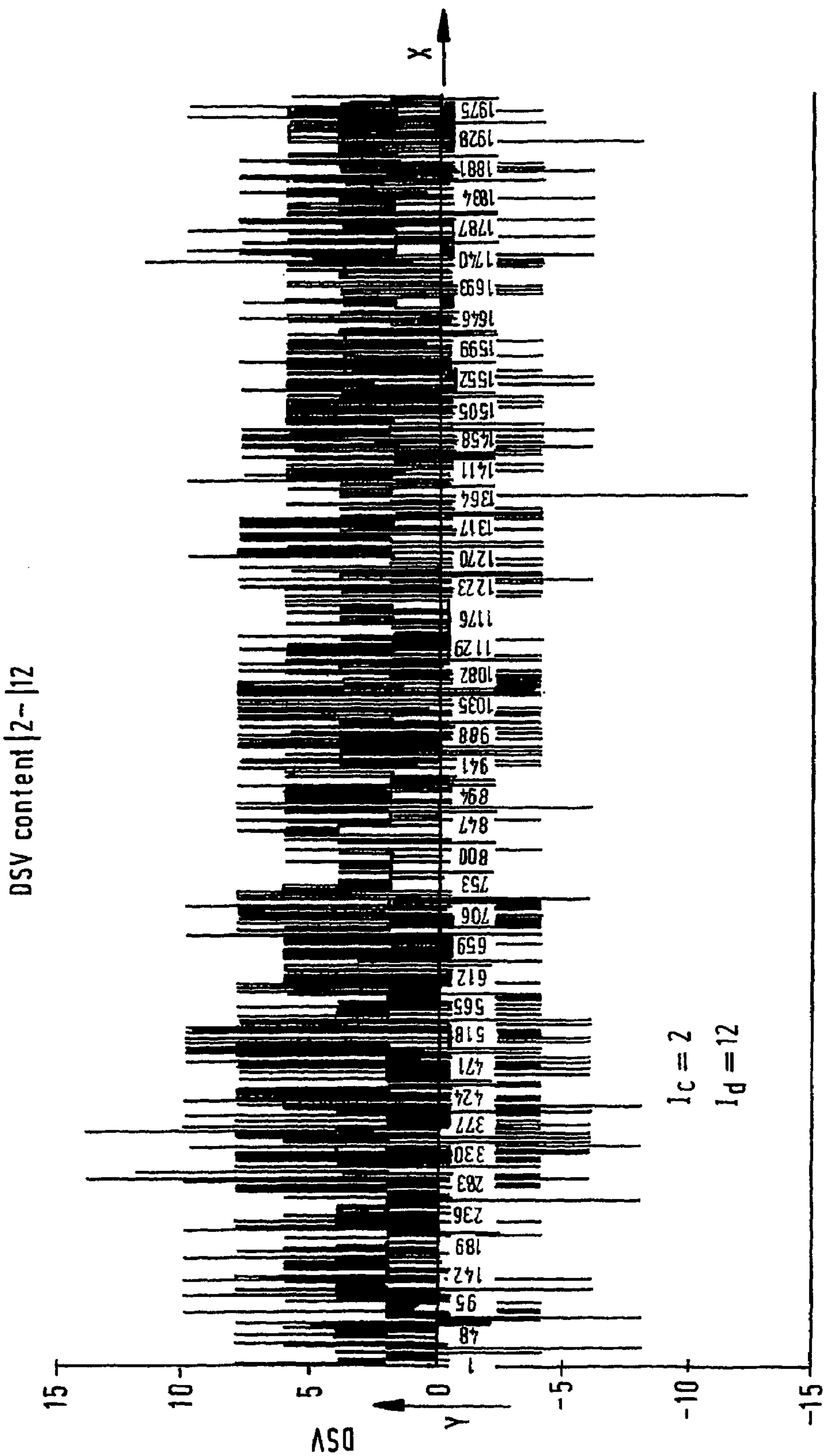

The invention will be further elucidated with reference to the drawing, in which:

FIG. 1 schematically represents a number of consecutive blocks of channel bits, FIG. 2 schematically represents the EFM signal associated with consecutive data symbols $35 and $CE when applying the I3-I11 and the I3-I14 rule, FIG. 3 schematically shows the EFM signal associated with consecutive data symbols $94 and $BC when applying the I2-I11 and the I3-I14 rule, FIG. 4 represents a diagram in which the curve of the digital sum variance is plotted against a number of read-out blocks of channel bits in a record carrier copied from a record carrier manufactured with the aid of the method, FIGS. 5 and 6 represent diagrams in which the course of the digital sum variance is plotted against a number of read-out blocks of channel bits in record carriers manufactured with the aid of the method according to the invention.

In the figures, corresponding parts are provided with the same reference numeral.

FIG. 1 shows a series 1 of consecutive blocks of channel bits 2 each comprising a block 3 of n1 information bits and a block 4 of n2 merge bits.

In the example given here, the starting point is an optical record carrier such as a CD, with n1=14 and n2=3. These numbers have been internationally selected and fixed, such that a series of data bits which has been divided into consecutive blocks of m=8 data bits each, can be converted into blocks of information bits 3, each with n1=14 bits, with intervening blocks of merge bits 4, whilst with consecutive blocks of channel bits 2 the number of consecutive channel bits of one type 1 or 0 is separated by at least Ia=3 and at most Ib=11 consecutive and continuous bits of the second type, 0 or 1, and vice versa. The conversion of the series of m=8 data bits to blocks 3 of n1=14 information bits is called EFM (eight to fourteen modulation). It has moreover appeared that with the aid of the thus selected value of n1=14 and n2=3, it is possible to ensure that the digital sum variance remains relatively limited.

The above-indicated values of Ia=3 and Ib=11 apply to traditionally manufactured CDs. In the record carrier according to the invention, over at least a portion of the record carrier, specific blocks of merge bits 4 are provided, with which, additionally, series of consecutive channel bits are permitted where a number of consecutive channel bits i of one type are separated by at most Ic or at least Id consecutive bits of the other type, with Ic<Ia=3 and Id>Ib=11.

For each block of merge bits with n2=3, a choice can be made from the series below 000
001
010
011
100
101
110
111

The blocks of merge bits are selected such that over a number of consecutive blocks of channel bits 2, for instance 100 to 500 blocks 2, in addition to the requirement that i=Ic<Ia or i=Id>Ib, it is ensured that the digital sum variance remains relatively limited.

If presently such a record carrier is read out, as is represented with the aid of arrow P1 in FIG. 1, due to the relatively limited digital sum variance, reading out will not present any problem and the blocks of information bits 3 can conventionally converted into blocks of data bits 5, each with m=8 data bits. If presently, with the aid of a copying apparatus known per se, the blocks of data bits 5 are written on a writeable record carrier, which is represented with the aid of arrow P2 in FIG. 1, then, in the copying apparatus, the blocks of data bits 5 are converted with the known EFM technique into consecutive blocks of information bits 3, each with n1=14 bits. In addition, with the aid of the copying apparatus, blocks of merge bits 6 are generated. These blocks of merge bits 6 now serve to ensure that the requirement is met that a number of consecutive channel bits i of one type are separated by at least Ia=3 and at most Ib=11 consecutive bits of the other type. Since the blocks of information bits 3 and the thus read-out blocks of data bits 5 as such meet the conventional requirements, it will be possible, by means of the copying apparatus, to generate such blocks of merge bits 6.

However, if presently the copied series 7 of blocks of channel bits 8 is read out, which is represented by means of arrow P3 in FIG. 1, then, during read-out at the copied record carrier with the modified blocks of merge bits 6, the digital sum variance will increase relatively fast, rendering the record carrier unreadable.

This effect can be enhanced by choosing blocks of information bits 3 which also lead to a disturbance of the digital sum variance in the original record carrier. In the original record carrier, however, it is possible, through the specific blocks of merge bits 4, to keep the digital sum variance within permissible limits. In the copied record carrier, as a result of the forced choice of the blocks of merge bits 6, a relatively fast and impermissible increase of the digital sum variance will arise, so that the copied record carrier becomes unreadable relatively fast.

FIG. 2 shows the EFM signal belonging to two consecutive data symbols which are designated by the codes $35 and $CE which are separated from each other by a block of merge bits 4 with n2=3. The consecutive data symbols are represented four times, the two symbols in each case being merged by a different block of merge bits 4. In the signal S1 represented in FIG. 2, the block of merge bits 4 is formed by a block "111", thereby satisfying the rule that the number of consecutive channel bits I of one type is separated by at least Ia=3 and at most Ib=11 consecutive bits of the other type.

The digital sum variance DSV after the two signals $35 and $CE has increased by 5.

In the second signal S2, the block of merge bits 4 is formed by the symbols "011", so that the DSV value increases by 3.

In the third signal S3, the block of merge bits 4 is formed by the block "001", whereby the DSV value increases by 1. In the signals S2 and S3, likewise the rule I3-I11 (Ia=3; Ib=11) is satisfied.

The signal S4 is likewise formed by the consecutive data symbols $35 and $CE. The $CE symbol, however, is represented in reversed polarity. The two symbols are coupled by a block of merge bits 4 consisting of "000". As a result, the last bits of the $35 symbol, the merge bits and the start bits of the $CE symbol have the same polarity and constitute a series of thirteen consecutive channel bits of the same type. In the signal S4, use is made of the rule I3-I14 (Ia=3 and Idmax=14). By the signal S4 the DSV value is reduced by 17. In this manner, it is possible to correct a relatively high DSY value relatively fast in the direction of a desired DSV value of 0. It will be clear that by locally permitting I12, I13 or I14, the control behavior of the signal can be considerably improved.

FIG. 3 shows, in a similar manner to FIG. 2, two consecutive data symbols which are separated by a block of merge bits 4. The data symbols involved here are $BC and $94. In the signal S5, which satisfies the I3-I11 rule (Ia=3 and Ib=11), the block of merge bits 4 can consist solely and exclusively of the block "111". This is because the last consecutive series of channel bits of the $BC signal consists of a single bit of polarity 1, while at the same time also the first consecutive series of channel bits of the $94 symbol consists of a single bit of polarity 1. If in the block of merge bits 4 a block other than the block "111" were selected, this would immediately lead to at least one block of consecutive channel bits having only one or two bits. Since the signal S5 must satisfy the I3-I11 rule, this is therefore impermissible. The effect of the consecutive data symbols $BC and $94 is that the DSV value increases by 11. If these symbols are placed behind each other a number of times, this will lead to a considerable undesired increase of the DSV value.

In the signal S6, again data symbols $BC and $94 are represented, with the $94 symbol indicated in reversed polarity. The symbols $BC and $94 are separated by a block of merge bits 4 comprising the bits "100". This means that adjacent the transition between the $BC symbol and the block of merge bits 4, a series with two consecutive channel bits of polarity 1 occurs. Since the signal S6 satisfies the rule I2-I11 (Ic=2 and Ib=11), this is in itself permissible. By reversing the polarity of the data symbol $94, the two consecutive data symbols $BC and $94 yield an increase of the DSV value of just 3. This is a considerably lower increase than in the case of the signal S5. Moreover, the first and last bit of the S6 signal have an opposite polarity. This entails the advantage that if the signal S6 is followed by a signal S6 again, but this time of a reversed polarity, the DSV value in this signal S6 will decrease by 3. This means that after an even number of signals S6 linked in this way, the DSV value will be 0.

As appears from FIG. 2 and FIG. 3, by permitting a number of consecutive channel bits less than Ia=3 or greater than Ib=11, a more effective control of DSV values can be obtained.

FIGS. 4–6 show different graphs where the X-axis plots the number of read-out blocks of channel bits 2 of record carriers each provided with the same series of consecutive blocks of information bits 3, while the Y-axis plots a value DSV for the digital sum variance.

FIG. 4 represents a graph of a record carrier with a particular series of consecutive blocks of information bits 3, with the blocks of merge bits 4 filled in so as to meet the I3-I11 (Ia=3 and Ib=11) rule. As is clearly visible, the DSV value falls drastically after about the $950^{th}$ symbol to a value near −16,000. Such a value makes the record carrier unreadable.

If presently the same series of consecutive blocks of information bits are provided on a record carrier with the aid of the method according to the invention, with Id values of 12, 13 or 14 being regarded as permissible too, the graph represented in FIG. 5 is obtained. Here, too, a gradual decrease of the DSV value can be seen, with the DSV value around the $1500^{th}$ symbol decreasing gradually to −1600. It is noted here that the scale along the Y-axis in FIG. 5 is a factor of 10 smaller than in FIG. 4. Such a DSV value is, in principle, temporarily permissible.

FIG. 6 represents a graph of another record carrier manufactured with the aid of the method according to the invention, where also values of Ic=2 and Id=12 have been permitted. This record carrier, too, is provided with a same series of consecutive blocks of information bits 3 as the record carrier used in FIGS. 4 and 5. The graph represented in FIG. 6 shows that by allowing the deviant blocks of consecutive channel bits such as Ic=2 and Id=12, the DSV value varies between −15 and +15. It will be clear that such a minor variation of DSV value has a very positive effect on readability.

From the graphs, the following can be derived as well. If a record carrier manufactured with the aid of the method according to the invention, of which the graphs are represented in FIG. 5 or 6, is read out, the blocks of information bits 3 are converted into blocks of data bits 8. If presently with the aid of the copying apparatus a copy of such a record carrier is made, in the copying apparatus the blocks of data bits 8 are converted into blocks of information bits 3. Further, blocks of merge bits 6 are provided between consecutive blocks of information bits 3, it being required, however, that the rule I3-I11 (Ia=3<i, Ib=11) be met. If presently a thus manufactured copy of the record carrier manufactured with the aid of the method according to the invention is read out, the diagram represented in FIG. 4 is obtained. As already indicated above, the DSV value will drop relatively fast to values near −16,000, which yields such a large disturbance of the digital sum variance that the record carrier is no longer readable.

The method according to the invention is also applicable with other kinds of record carriers with other values for the number of data bits m, the number of information bits n1, the number of merge bits n2, and/or the number of conventionally permissible consecutive channel bits i (Ia≦i≦Ib).

What is claimed is:

1. A method for manufacturing a record carrier which can be copied with the aid of a copying apparatus, whilst the copied record carrier is unreadable, which original record carrier is provided with a series of binary data bits which has been encoded into a series of binary channel bits, which series of data bits has been divided into consecutive blocks (5) of m data bits each, which blocks (5) have been encoded into consecutive blocks (2) of (n1+n2) channel bits ((n1+n2)>m), which blocks of channel bits (2) each comprise a block (3) of n1 information bits and a block (4) of n2 merge bits, wherein consecutive blocks of information bits (3) are separated in each case by a block of merge bits, while during copying with the aid of the copying apparatus, the merge bits are selected such that consecutive channel bits of a first type, the type "1", are separated by at least Ia and at most Ib consecutive and continuous bits of the second type, the type "0", and vice versa, characterized in that the original record carrier, at least over a number of neighboring blocks of channel bits (2), is provided with specific blocks of merge bits (4), while consecutive channel bits of one type are separated by at most Ic or at least Id consecutive bits of the other type, with Ic<Ia and Id>Ib, as a result of which, in a record carrier copied with the aid of the copying apparatus, a digital sum variance, which is proportional to a difference, present over a number of blocks of channel bits, between the number of channel bits of the one type and the number of channel bits of the other type, becomes impermissibly large.

2. A method according to claim 1, characterized in that the original record carrier, at least adjacent the specific blocks of merge bits, is provided with specific blocks of information bits as a result of which in a record carrier copied with the copying apparatus the digital sum variance becomes impermissibly large relatively rapidly.

3. A method according to claim 1, characterized in that Ic is 2.

4. A method according to claim 1, characterized in that Id is 12, 13 or 14.

5. A record carrier manufactured with the aid of the method according to claim 1.

* * * * *